United States Patent
Enquist

(10) Patent No.: US 11,830,838 B2
(45) Date of Patent: Nov. 28, 2023

(54) CONDUCTIVE BARRIER DIRECT HYBRID BONDING

(71) Applicant: ADEIA SEMICONDUCTOR BONDING TECHNOLOGIES INC., San Jose, CA (US)

(72) Inventor: Paul M. Enquist, Cary, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 17/677,161

(22) Filed: Feb. 22, 2022

(65) Prior Publication Data

US 2022/0254746 A1 Aug. 11, 2022

Related U.S. Application Data

(60) Continuation of application No. 16/383,455, filed on Apr. 12, 2019, now Pat. No. 11,264,345, which is a (Continued)

(51) Int. Cl.
*H01L 23/00* (2006.01)
*H01L 21/50* (2006.01)
(Continued)

(52) U.S. Cl.
CPC .............. *H01L 24/09* (2013.01); *H01L 21/50* (2013.01); *H01L 24/03* (2013.01); *H01L 24/05* (2013.01);
(Continued)

(58) Field of Classification Search
None
See application file for complete search history.

(56) References Cited

U.S. PATENT DOCUMENTS 4,612,083 A 9/1986 Yasumoto et al.
4,818,728 A 4/1989 Rai et al.
(Continued)

FOREIGN PATENT DOCUMENTS

CN 104576518 4/2015
EP 0 465 227 A2 1/1992
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Michelle Mandala
(74) *Attorney, Agent, or Firm* — Knobbe, Martens, Olson & Bear LLP

(57) ABSTRACT

A method for forming a direct hybrid bond and a device resulting from a direct hybrid bond including a first substrate having a first set of metallic bonding pads, preferably connected to a device or circuit, capped by a conductive barrier, and having a first non-metallic region adjacent to the metallic bonding pads on the first substrate, a second substrate having a second set of metallic bonding pads capped by a second conductive barrier, aligned with the first set of metallic bonding pads, preferably connected to a device or circuit, and having a second non-metallic region adjacent to the metallic bonding pads on the second substrate, and a contact-bonded interface between the first and second set of metallic bonding pads capped by conductive barriers formed by contact bonding of the first non-metallic region to the second non-metallic region.

23 Claims, 7 Drawing Sheets

Related U.S. Application Data continuation of application No. 15/947,461, filed on Apr. 6, 2018, now Pat. No. 10,262,963, which is a division of application No. 14/835,379, filed on Aug. 25, 2015, now Pat. No. 9,953,941.

(51) Int. Cl.
  *H01L 25/065* (2023.01)
  *H01L 25/00* (2006.01)

(52) U.S. Cl.
  CPC ............ *H01L 24/08* (2013.01); *H01L 24/80* (2013.01); *H01L 24/89* (2013.01); *H01L 25/0657* (2013.01); *H01L 25/50* (2013.01); *H01L 2224/036* (2013.01); *H01L 2224/0345* (2013.01); *H01L 2224/03452* (2013.01); *H01L 2224/03462* (2013.01); *H01L 2224/03616* (2013.01); *H01L 2224/03825* (2013.01); *H01L 2224/05005* (2013.01); *H01L 2224/05007* (2013.01); *H01L 2224/05026* (2013.01); *H01L 2224/0556* (2013.01); *H01L 2224/0557* (2013.01); *H01L 2224/05078* (2013.01); *H01L 2224/05082* (2013.01); *H01L 2224/05124* (2013.01); *H01L 2224/05147* (2013.01); *H01L 2224/05562* (2013.01); *H01L 2224/05573* (2013.01); *H01L 2224/05655* (2013.01); *H01L 2224/05657* (2013.01); *H01L 2224/05666* (2013.01); *H01L 2224/05676* (2013.01); *H01L 2224/05681* (2013.01); *H01L 2224/05684* (2013.01); *H01L 2224/05686* (2013.01); *H01L 2224/08112* (2013.01); *H01L 2224/08121* (2013.01); *H01L 2224/08123* (2013.01); *H01L 2224/08145* (2013.01); *H01L 2224/08147* (2013.01); *H01L 2224/80011* (2013.01); *H01L 2224/8019* (2013.01); *H01L 2224/80031* (2013.01); *H01L 2224/80035* (2013.01); *H01L 2224/80047* (2013.01); *H01L 2224/80075* (2013.01); *H01L 2224/80097* (2013.01); *H01L 2224/80099* (2013.01); *H01L 2224/80194* (2013.01); *H01L 2224/80895* (2013.01); *H01L 2224/80896* (2013.01); *H01L 2224/80935* (2013.01); *H01L 2224/80986* (2013.01); *H01L 2225/06513* (2013.01)

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,419,806 A | 5/1995 | Huebner |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,054,363 A | 4/2000 | Sakaguchi et al. |
| 6,071,761 A | 6/2000 | Jacobs |
| 6,080,640 A | 6/2000 | Gardner et al. |
| 6,097,096 A | 8/2000 | Gardner et al. |
| 6,147,000 A | 11/2000 | You et al. |
| 6,183,592 B1 | 2/2001 | Sylvester |
| 6,218,203 B1 | 4/2001 | Khoury et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,206 B1 | 12/2001 | Ito et al. |
| 6,348,709 B1 | 2/2002 | Graettinger et al. |
| 6,359,235 B1 | 3/2002 | Hayashi |
| 6,374,770 B1 | 4/2002 | Lee |
| 6,399,974 B1 | 6/2002 | Ohtsuki |
| 6,423,640 B1 | 7/2002 | Lee et al. |
| 6,465,892 B1 | 10/2002 | Suga |
| 6,515,343 B1 | 2/2003 | Shroff et al. |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,593,645 B2 | 7/2003 | Shih et al. |
| 6,600,224 B1 | 7/2003 | Farquhar et al. |
| 6,624,003 B1 | 9/2003 | Rice |
| 6,627,814 B1 | 9/2003 | Stark |
| 6,642,081 B1 | 11/2003 | Patti |
| 6,656,826 B2 | 12/2003 | Ishimaru |
| 6,660,564 B2 | 12/2003 | Brady |
| 6,661,085 B2 | 12/2003 | Kellar et al. |
| 6,667,225 B2 | 12/2003 | Hau-Riege et al. |
| 6,720,212 B2 | 4/2004 | Robl et al. |
| 6,759,703 B1 | 7/2004 | Matsuhashi |
| 6,828,686 B2 | 12/2004 | Park |
| 6,847,527 B2 | 1/2005 | Sylvester et al. |
| 6,864,172 B2 | 3/2005 | Noma et al. |
| 6,867,073 B1 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,960,492 B1 | 11/2005 | Miyamoto |
| 6,962,835 B2 | 11/2005 | Tong et al. |
| 7,045,453 B2 | 5/2006 | Canaperi et al. |
| 7,078,811 B2 | 7/2006 | Suga |
| 7,094,701 B2 | 8/2006 | Umemoto et al. |
| 7,105,980 B2 | 9/2006 | Abbott et al. |
| 7,109,063 B2 | 9/2006 | Jiang |
| 7,126,212 B2 | 10/2006 | Enquist et al. |
| 7,193,239 B2 | 3/2007 | Leedy |
| 7,193,423 B1 | 3/2007 | Dalton et al. |
| 7,247,948 B2 | 7/2007 | Hedler et al. |
| 7,354,798 B2 | 4/2008 | Pogge et al. |
| 7,485,968 B2 | 2/2009 | Enquist et al. |
| 7,750,488 B2 | 7/2010 | Patti et al. |
| 7,803,693 B2 | 9/2010 | Trezza |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |

(56) References Cited

U.S. PATENT DOCUMENTS

| | | | |
|---|---|---|---|
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,916,448 B2 | 12/2014 | Cheng et al. | |
| 8,988,299 B2 | 3/2015 | Kam et al. | |
| 9,093,350 B2 | 7/2015 | Endo et al. | |
| 9,111,763 B2 | 8/2015 | Kagawa et al. | |
| 9,142,517 B2 | 9/2015 | Liu | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,455,182 B2 | 9/2016 | Edelstein et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,601,371 B2 | 3/2017 | Edelstein et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,929,050 B2 * | 3/2018 | Lin | H01L 21/76898 |
| 9,941,241 B2 | 4/2018 | Edelstein et al. | |
| 9,941,243 B2 | 4/2018 | Kim et al. | |
| 9,947,579 B2 | 4/2018 | Edelstein et al. | |
| 9,947,581 B2 | 4/2018 | Edelstein et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,147,641 B2 | 12/2018 | Enquist et al. | |
| 10,224,241 B2 | 3/2019 | Edelstein et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,325,806 B2 | 6/2019 | Edelstein et al. | |
| 10,446,456 B2 | 10/2019 | Shen et al. | |
| 11,011,418 B2 | 5/2021 | Enquist et al. | |
| 11,069,734 B2 | 7/2021 | Katkar | |
| 2002/0000328 A1 | 1/2002 | Motomura et al. | |
| 2002/0003307 A1 | 1/2002 | Suga | |
| 2002/0025665 A1 | 2/2002 | Juengling | |
| 2002/0074670 A1 | 6/2002 | Suga | |
| 2002/0094661 A1 | 7/2002 | Enquist et al. | |
| 2002/0113241 A1 | 8/2002 | Kubota et al. | |
| 2002/0113317 A1 | 8/2002 | Okushima | |
| 2002/0163079 A1 | 11/2002 | Awano | |
| 2002/0173120 A1 | 11/2002 | Enquist | |
| 2003/0040161 A1 | 2/2003 | Schrenk et al. | |
| 2003/0092220 A1 | 5/2003 | Akram | |
| 2003/0109083 A1 | 6/2003 | Ahmad | |
| 2003/0113976 A1 | 6/2003 | Hau-Riege et al. | |
| 2003/0129796 A1 | 7/2003 | Bruchhaus et al. | |
| 2003/0157748 A1 | 8/2003 | Kim et al. | |
| 2003/0224595 A1 | 12/2003 | Smith et al. | |
| 2003/0232498 A1 | 12/2003 | Harada | |
| 2004/0038154 A1 | 2/2004 | Muramatsu et al. | |
| 2004/0056361 A1 | 3/2004 | McTeer | |
| 2004/0084414 A1 | 5/2004 | Sakai et al. | |
| 2004/0152256 A1 | 8/2004 | Noguchi et al. | |
| 2004/0157407 A1 | 8/2004 | Tong et al. | |
| 2004/0217483 A1 | 11/2004 | Hedler et al. | |
| 2004/0219776 A1 | 11/2004 | Park | |
| 2004/0222526 A1 | 11/2004 | Wada et al. | |
| 2004/0227241 A1 | 11/2004 | Enomoto | |
| 2004/0245630 A1 | 12/2004 | Huang et al. | |
| 2004/0245636 A1 | 12/2004 | Cooney, III et al. | |
| 2004/0262772 A1 | 12/2004 | Ramanathan et al. | |
| 2005/0003649 A1 | 1/2005 | Takao | |
| 2005/0014311 A1 | 1/2005 | Hayasaka et al. | |
| 2005/0176239 A1 | 8/2005 | Kronke et al. | |
| 2005/0181542 A1 | 8/2005 | Enquist | |
| 2005/0266636 A1 | 12/2005 | Kitamura et al. | |
| 2006/0024950 A1 | 2/2006 | Choi et al. | |
| 2006/0057945 A1 | 3/2006 | Hsu et al. | |
| 2007/0096294 A1 | 5/2007 | Ikeda et al. | |
| 2007/0111386 A1 | 5/2007 | Kim et al. | |
| 2007/0212870 A1 | 9/2007 | Yang et al. | |
| 2007/0222048 A1 | 9/2007 | Huang | |
| 2007/0295456 A1 | 12/2007 | Gudeman et al. | |
| 2008/0122092 A1 | 5/2008 | Hong | |
| 2009/0197408 A1 | 8/2009 | Lehr et al. | |
| 2009/0200668 A1 | 8/2009 | Yang et al. | |
| 2011/0074040 A1 | 3/2011 | Frank et al. | |
| 2011/0290552 A1 | 12/2011 | Palmateer et al. | |
| 2012/0211894 A1 | 8/2012 | Aoyagi | |
| 2012/0212384 A1 | 8/2012 | Kam et al. | |
| 2012/0319280 A1 | 12/2012 | Suganuma et al. | |
| 2013/0020704 A1 | 1/2013 | Sadaka | |
| 2013/0207268 A1 | 8/2013 | Chapelon | |
| 2013/0221527 A1 | 8/2013 | Yang et al. | |
| 2013/0285248 A1 | 10/2013 | Yin et al. | |
| 2013/0320556 A1 | 12/2013 | Liu et al. | |
| 2013/0328186 A1 | 12/2013 | Uzoh et al. | |
| 2014/0175655 A1 | 6/2014 | Chen et al. | |
| 2014/0225795 A1 | 8/2014 | Yu | |
| 2014/0252635 A1 | 9/2014 | Tran et al. | |
| 2014/0264948 A1 | 9/2014 | Chou et al. | |
| 2014/0353828 A1 | 12/2014 | Edelstein et al. | |
| 2015/0064498 A1 | 3/2015 | Tong | |
| 2015/0108644 A1 | 4/2015 | Kuang et al. | |
| 2015/0206823 A1 | 7/2015 | Lin et al. | |
| 2016/0343682 A1 | 11/2016 | Kawasaki | |
| 2017/0179029 A1 | 6/2017 | Enquist et al. | |
| 2017/0194271 A1 | 7/2017 | Hsu et al. | |
| 2017/0200711 A1 | 7/2017 | Uzoh et al. | |
| 2017/0338214 A1 | 11/2017 | Uzoh et al. | |
| 2018/0096931 A1 | 4/2018 | Huang et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0226375 A1 | 8/2018 | Enquist et al. | |
| 2018/0286805 A1 | 10/2018 | Huang et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0096741 A1 | 3/2019 | Uzoh et al. | |
| 2019/0096842 A1 | 3/2019 | Fountain, Jr. et al. | |
| 2019/0115247 A1 | 4/2019 | Tong et al. | |
| 2019/0115277 A1 | 4/2019 | Yu et al. | |
| 2019/0131277 A1 | 5/2019 | Yang et al. | |
| 2019/0147222 A1 | 5/2019 | Gao et al. | |
| 2019/0198407 A1 | 6/2019 | Huang et al. | |
| 2019/0198409 A1 | 6/2019 | Katkar et al. | |
| 2019/0237419 A1 | 8/2019 | Enquist | |
| 2019/0265411 A1 | 8/2019 | Huang et al. | |
| 2019/0333550 A1 | 10/2019 | Fisch | |
| 2019/0348336 A1 | 11/2019 | Katkar et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0075534 A1 | 3/2020 | Gao et al. | |

(56) References Cited

U.S. PATENT DOCUMENTS

| | | | |
|---|---|---|---|
| 2020/0118973 | A1 | 4/2020 | Wang et al. |
| 2020/0126906 | A1 | 4/2020 | Uzoh et al. |
| 2020/0140267 | A1 | 5/2020 | Katkar et al. |
| 2020/0140268 | A1 | 5/2020 | Katkar et al. |
| 2020/0194396 | A1 | 6/2020 | Uzoh |
| 2020/0227367 | A1 | 7/2020 | Haba et al. |
| 2020/0294908 | A1 | 9/2020 | Haba et al. |
| 2020/0328162 | A1 | 10/2020 | Haba et al. |
| 2020/0328164 | A1 | 10/2020 | DeLaCruz et al. |
| 2020/0328165 | A1 | 10/2020 | DeLaCruz et al. |
| 2020/0365575 | A1 | 11/2020 | Uzoh et al. |
| 2020/0371154 | A1 | 11/2020 | DeLaCruz et al. |
| 2020/0395321 | A1 | 12/2020 | Katkar et al. |
| 2021/0098412 | A1 | 4/2021 | Haba et al. |
| 2021/0181510 | A1 | 6/2021 | Katkar et al. |
| 2021/0193603 | A1 | 6/2021 | Katkar et al. |
| 2021/0193625 | A1 | 6/2021 | DeLaCruz et al. |
| 2021/0242152 | A1 | 8/2021 | Fountain, Jr. et al. |
| 2021/0280461 | A1 | 9/2021 | Enquist et al. |
| 2021/0296282 | A1 | 9/2021 | Gao et al. |
| 2021/0313225 | A1 | 10/2021 | Enquist et al. |

FOREIGN PATENT DOCUMENTS

| | | |
|---|---|---|
| JP | 01-168040 | 7/1989 |
| JP | 4-259249 | 9/1992 |
| JP | 05-029183 | 2/1993 |
| JP | 6-13456 | 1/1994 |
| JP | 6-260594 | 9/1994 |
| JP | H07-66093 | 3/1995 |
| JP | H7-249749 | 9/1995 |
| JP | 7-283382 | 10/1995 |
| JP | 8-78645 | 3/1996 |
| JP | 8-125121 | 5/1996 |
| JP | 8-186235 | 7/1996 |
| JP | 9-120979 | 5/1997 |
| JP | 10-135404 | 5/1998 |
| JP | 10-223636 | 8/1998 |
| JP | 10-242383 | 9/1998 |
| JP | 11-186120 | 7/1999 |
| JP | 2000-100679 | 4/2000 |
| JP | 2000-260934 | 9/2000 |
| JP | 2000-299379 | 10/2000 |
| JP | 2000-311982 | 11/2000 |
| JP | 2001-102479 | 4/2001 |
| JP | 2001-326326 | 11/2001 |
| JP | 2002-026123 | 1/2002 |
| JP | 2002-516033 | 5/2002 |
| JP | 2002-353416 | 12/2002 |
| JP | 2002-368159 | 12/2002 |
| JP | 2003-023071 | 1/2003 |
| JP | 2004-200547 | 7/2004 |
| JP | 2005-086089 | 3/2005 |
| JP | 2005-093486 | 4/2005 |
| JP | 2005-135988 | 5/2005 |
| JP | 2012-019148 A | 1/2012 |
| JP | 2013-033786 A | 2/2013 |
| JP | 2018-160519 | 10/2018 |
| KR | 10-2015-0097798 | 8/2015 |
| KR | 10-0580212 | 5/2016 |
| TW | 476145 | 2/2002 |
| WO | WO 01/61743 A1 | 8/2001 |
| WO | WO 03/054954 A2 | 7/2003 |
| WO | WO 2005/043584 A2 | 5/2005 |
| WO | WO 2006/100444 A1 | 9/2006 |
| WO | WO 2017/151442 A1 | 9/2017 |

OTHER PUBLICATIONS

Appeal Decision of Rejection dated Apr. 12, 2016 in Japanese Patent Application No. 2008-526104, in 14 pages.

Aspar, B. et al., "The smart-cut process: Status and developments," Proc. Electrochem Soc., 1999, vol. 99-53, pp. 48-59.

Bower, R. et al., "Low temperature Si3N4 direct bonding," Appl. Phys. Lett., Jun. 28, 1993, vol. 62, No. 26, pp. 3485-3487.

Canadian Office Action dated Aug. 1, 2013 in Canadian Patent Application No. 2,618,191, 4 pages.

Canadian Office Action, dated May 16, 2012 for Canadian Patent Application No. 2,515,375, with international preliminary report, 2 pages.

Ceramic Microstructures: Control at the Atomic Level, Recent Progress in Surface Activated Bonding, 1998, pp. 385-389.

Chung et al., "Room temperature GaAseu +Si and InPeu +Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

D'Agostino, R., "Plasma etching of Si and SiO2 in SF6–O2 mixtures," J. Appl. Phys., Jan. 1981, vol. 52, No. 1, pp. 162-167.

Decision—Request for Trail Granted, Inter Partes Review, U.S. Pat. No. 7,485,968, Case IPR2013-00381, dated Dec. 18, 2013, in 27 pages.

Declaration of Amanda Peil, Civil Action No. 17-7609 (RMB)(KMW), *Invensas Bonding Technologies, Inc. v. Samsung Electronics America, Inc. and Samsung Electronics Co., Ltd.*, 99 pages.

Declaration of Richard A. Blanchard in Support of Petition for inter partes review of U.S. Pat. No. 7,485,968, dated Jun. 13, 2013, pp. 1-18.

European Office Action dated Oct. 11, 2011 in European Patent Application No. 06789507.8, in 8 pages.

European Search Report dated Sep. 5, 2011 in European Patent Application No. 06789507.8, in 5 pages.

Fan et al., "Copper water bonding," Electrochem. Solid-State Lett., U.S.A., The Electrochemical Society, Aug. 6, 1999, vol. 2, No. 10, pp. 534-536.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding ofsilicon to glass and sapphire," Electrochemical Society Proceedings vol. 95-7, 1995, pp. 72-77.

Final Written Decision, Inter PartesReview, U.S. Pat. No. 7,485,968, Case IPR2013-00381, dated Feb. 27, 2014, in 3 pages.

Gösele et al., "Semiconductor Wafer Bonding: A flexible approach to materials combinations in microelectronics; micromechanics and optoelectronics," IEEE, 1997, pp. 23-32.

Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.

Handbook of Thin Film Technology, Maissel and Glang, 1983 Reissue, pp. 12-24.

Harendt, C. et al., "Vertical polysilicon interconnects by aligned wafer bonding," Electrochemical Society Proceedings, 1998, vol. 97-36, pp. 501-508.

Hayashi, Y. et al., "Fabrication of three-dimensional IC using cumulatively bonded IC (CUBIC) technology," VSLI Tech. Dog., 1990, pp. 95-96.

Hizukuri, M. et al., "Dynamic strain and chip damage during ultrasonic flip chip bonding," Jpn. J. Appl. Phys. 40, 2001, pp. 3044-3048.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si-wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7.

(56) References Cited

OTHER PUBLICATIONS

Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
Iida, A. et al., "The study of initial mechanism for Al—Au solid phase diffusion flip-chip bonding," Jpn. J. Appl. Phys. 40, 1997, pp. 3044-3661.
International Preliminary Report on Patentability dated Mar. 8, 2018, PCT Application No. PCT/US2016/048609, 12 pages.
International Search Report and Written Opinion dated Apr. 22, 2019 in International Application No. PCT/US2018/064982, 13 pages.
International Search Report and Written Opinion dated Mar. 7, 2019, in International Application No. PCT/US2018/060044, 14 pages.
International Search Report and Written Opinion dated Nov. 29, 2016 in PCT Application No. PCT/US2016/048609, 15 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Japanese Office Action dated Aug. 4, 2015 issued in Japanese Patent Application No. 2008-526104 (with English translation).
Japanese Office Action dated Sep. 29, 2015 in Japanese Patent Application No. 2012-246660 (English translation), in 3 pages.
Japanese Office Action dated Feb. 2, 2016 in Japanese Patent Application No. 2013-246782 (English translation), in 2 pages.
Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Kissinger, G. et al., "Void-free silicon-wafer-bond stregthening in the 200-400 C range," Sensors and Actuators A, 1993, vol. 36, pp. 149-156.
Krauter, G. et al., "Low temperature silicon direct bonding for application in micromechanics: bonding energies fordifferent combinations of oxides," Sensors and Actuators A, 1998, vol. 70, pp. 271-275.
Kunio, Takemitsu, "Three dimensional IC technology, using cubic method," Journal of the JWS, Japan Welding Society, Apr. 5, 1994, Vol. 63, No. 3, pp. 185-189.
Li, Y.A. et al., "Low temperature copperto copperdirect bonding," Jpn. Appl. Phys. 37, 1998, pp. L1068-L1069.
Li, Y.A. et al., "Systematic low temperature silicon bonding using pressure and temperature," Jpn. J. Appl. Phys., vol. 37, 1998, pp. 737-741.
Matsuzawa et al., "Room-temperature interconnection of electroplated Au microbump by means of surface activated bonding method," Electornic Components and Technology Confererence, 2001, 51st Proceedings, IEEE, pp. 384-387.
Monsma et al., "Development of the spin-valve transistor," IEEE Tran. Magnet, vol. 33, No. 5, Sep. 1997, pp. 3495-3499.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Petition for Inter Partes Review of U.S. Pat. No. 7,485,968, IPR 2013-00381, filed Jun. 21, 2013, pp. 1-49.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Schmidt, Martin A., Wafer-To-Wafer Bonding for Microstructure Formation, Proceedings of the IEEE, vol. 86, No. 8, 1998, pp. 1575-1586.
Shigetou et al., "Cu—Cu direct bonding for bump-less interconnect," Research Center for Advanced Science and Technolog., University of Tokyo, Optoelectronic Packaging and Solder Bumps, (2002), pp. 628-639.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shigetou et al., "Room-temperature direct bonding of CMP-Cu for bumpless interconnection," Research Center forAdvanced Science and Technology, University of Tokyo, 2001 Electronic Components and Technology Conference, pp. 1-6.
Shimatsu et al., IEEE Tran. Magnet. 33, 3495 (1997).
Shimatsu, T. et al., "Metal bonding during sputter film deposition," J. Vac. Sci. Technol. A 16(4), 1998, pp. 2125-2131.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Steinkirchner, J. et al., "Silicon wafer bonding via designed monolayers," Advanced Materials, 1995, vol. 7, No. 7, 7 pages.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.

(56) References Cited

OTHER PUBLICATIONS

Suga et al., "A new wafer-bonder of ultra-high precision using surface activated bonding (SAB) concept," Electronic Components and Technology Conference, 2001, IEEE, pp. 1013-1018.
Suga et al., "Bump-Less Interconnect For Next Generation System Packaging," Electronic Components And Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Taiwanese Office Action dated Dec. 11, 2015 in Taiwanese Patent Application No. 095129638 (with English translation).
Taiwanese Office Action dated Jan. 25, 2018 in Taiwanese Patent Application No. 105126081 (with English translation), 20 pages.
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature bonding of lithium niobate and silicon wafers by argon-beam surface activation," Appl. Phys. Lett., 1999. vol. 74, pp. 2387.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface aotivation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.
Tong, Q.Y. et al., "Semiconductor wafer bonding," Materials Chemistry and Physics, R25, 1999, 239 pages (exerpts).
Tong, Q.Y. et al., "Semiconductor wafer bonding: recent developments," Materials Chemistry and Physics, vol. 37, 1994, pp. 101-127.
Tong, Q.Y. et al., "Semiconductor wafer bonding: science and technology," 1999, 120 pages.
Tong, Q.Y. et al., "Semiconductor wafer bonding: science and technology," 1999, 159 pages.
Tong, Q.Y. et al., "Wafer bonding and layer splitting for microsystems," Advanced Materials, 1999, vol. 11, No. 17, pp. 1409-1425.
Topol et al., "Enabling technologies forwafer-level bonding of 3D MEMS and integrated circuit structures," 2004 Electronics Components and Technology Conference, 2004 IEEE, pp. 931-938.
Tsau et al., "Fabrication process and plasticity of gold-gold thermocompression bonds," Mater. Soc. Symp. Proc. 605, 171 (1999).
Tsau, C.H. et al., "Characterization of low temperature wafer-level gold-gold thermocompression bonds," Mater. Soc. Symp. Proc. 605, 1999, pp. 171-176.
Vossen, J. et al., "Thin Film Processes II," Academic Press, 1991, 62 pages.
Vossen, J. et al., "Thin Film Processes," Academic Press, 1978, 62 pages.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Warner, K. et al., "Low-temperature oxide-bonded three-dimensional integrated circuits," IEEE International SOI Conference, Oct. 2012, pp. 123-125.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Wikipedia, "Chemical bond," URL http://en.wikipedia.org/wiki/chemical_bond, accessed on Mar. 31, 2010, 10 pages.
Wikipedia, "Van der Waals force," URL https://en.wikipedia.org/wiki/Van_der_Waals_force, originally accessed on Mar. 31, 2010, 7 pages.
Xu et al., "New Au—Al interconnect technology and its reliability by surface activated bonding," Electronic Packaging Technology Proceedings, Oct. 28-30, 2003, Shanghai, China, pp. 479-483.
Yablonovitch et al., Pd layer as a bonding layer on GaAs wafers for bonding GaAs/GaAs at 200° C., Appl. Phys. Lett. 59, 3159 (1991).
Yablonovitch, E. et al., "Van der Waals bonding of GaAs on Pd leads to a permanent, solid-phase-topotaxial metallurgical bond," Appl. Phys. Lett. 59, 1991, pp. 3159-3161.

* cited by examiner

CONDUCTIVE BARRIER DIRECT HYBRID BONDING

CROSS-REFERENCE TO RELATED APPLICATIONS

This application is a continuation of U.S. patent application Ser. No. 16/383,455, filed on Apr. 12, 2019, which is a continuation of U.S. patent application Ser. No. 15/947,461, filed on Apr. 6, 2018, which is a divisional of U.S. patent application Ser. No. 14/835,379, now U.S. Pat. No. 9,953,941, filed on Aug. 25, 2015, the entire contents of each of which are incorporated by reference. This application is related to application Ser. Nos. 09/505,283, 10/359,608 and 11/201,321, the entire contents of which are incorporated herein by reference.

BACKGROUND OF THE INVENTION

Field of the Invention

The present invention relates to the field of direct bonding, more specifically hybrid direct bonding, preferably at room or low temperature, and more particularly to the bonding of semiconductor materials, devices, or circuits to be utilized in stacked semiconductor device and integrated circuit fabrication and even more particularly to the fabrication of value-added parts in consumer and business products including image sensors in mobile phones, RF front ends in cell phones, 3D memory in high performance graphics products, and 3D memory in servers.

Description of the Related Art

Die, chip, or wafer stacking has become an industry standard practice to the continuing demands of increased functionality in a smaller form factor at lower cost. In general, stacking can be done with electrical interconnections between layers in the stack formed either as part of the stacking process or after the stacking process. An example of electrical interconnections formed after the stacking process is the use of through silicon via (TSV) etching and filling through one layer in the stack and into an adjacent layer in the stack to make electrical interconnections between layers in the stack. Examples of these three dimensional (3D) electrical interconnections formed as part of the stacking process include solder bumps and copper pillar, either with or without underfill, hybrid bonding and direct hybrid bonding. Realization of the 3D electrical interconnections as part of the stacking process is advantageous for a number of reasons including but not limited to eliminating the cost and exclusion requirements of TSV (through silicon via) technology. Direct hybrid bonding, also referred to as Direct Bond Interconnect (DBI®), is advantageous over other forms of stacking for a number of reasons including but not limited to a planar bond over metal and dielectric surface components that provides high strength at low temperature and enables 3D interconnect pitch scaling to submicron dimensions.

The metal and dielectric surface components used for a direct hybrid bond can be comprised of a variety of combinations of metals and dielectrics in a variety of patterns formed with a variety of fabrication techniques. Non-limiting examples of metals include copper, nickel, tungsten, and aluminum. See for example; P. Enquist, "High Density Direct Bond Interconnect (DBI™) Technology for Three Dimensional Integrated Circuit Applications", Mater. Res. Soc. Symp. Proc. Vol. 970, 2007, p. 13-24; P. Gueguen, et. al., "3D Vertical Interconnects by Copper Direct Bonding," Mater. Res. Soc. Symp. Proc. Vol. 1112, 2009, p. 81; P. Enquist, "Scalability and Low Cost of Ownership Advantages of Direct Bond Interconnect (DBI®) as Drivers for Volume Commercialization of 3-D Integration Architectures and Applications", Mater, Res. Soc. Symp. Proc. Vol. 1112, 2009, p. 81; Di Cioccio, et. al., "Vertical metal interconnect thanks to tungsten direct bonding", 2010 Proceedings $60^{th}$ ECTC, 1359-1363; H. Lin, et. al., "Direct Al—Al contact using lot temperature wafer bonding for integrating MEMS and CMOS devices," Microelectronics Engineering, 85, (2008), 1059-1061. Non-limiting examples of dielectrics include silicon oxide, silicon nitride, silicon oxynitride, and silicon carbon nitride. See for example P. Enquist, "3D Technology Platform—Advanced Direct Bond Technology", C. S. Tan, K.-N. Chen, and S. J. Koester (Editors), "3D Integration for VLSI Systems," Pan Stanford, ISBN 978-981-4303-81-1, 2011 and J. A. Ruan, S. K. Ajmera, C. Jin, A. J. Reddy, T. S. Kim, "Semiconductor device having improved adhesion and reduced blistering between etch stop layer and dielectric layer", U.S. Pat. No. 7,732,324, B2 Non-limiting examples of a variety of patterns include arrays of vias or arrays of metal lines and spaces, for example as found in via and routing layers in CMOS back-end-of-line (BEOL) interconnect fabrication. Within these examples, 3D electrical interconnections may be formed by alignment and bonding of metal vias to metal vias, metal vias to metal lines, or metal lines to metal lines. Non-limiting examples of fabrication techniques to build a surface suitable for a hybrid bond are industry standard single and dual damascene processes adjusted to satisfy a suitable topography specification, if necessary.

There are basically two types of CMOS BEOL fabrication processes. One is typically referred to as an aluminum (Al) BEOL and the other is referred to as a copper (Cu) BEOL. In an Al BEOL process, Al with a suitable conductive barrier layer is typically used as the routing layer and tungsten (W), with a suitable conductive barrier layer is used for a via layer to electrically interconnect between two adjacent Al routing layers. The Al routing layer is typically dry etched and subsequently planarized with a dielectric deposition followed by chemo-mechanical polishing (CMP). The W via layer is typically formed with a single damascene process comprised of dielectric deposition, via patterning and etching to the previous routing layer, via filling with conductive barrier layer physical vapor deposition and W chemical vapor deposition, and CMP of W and conductive barrier layer to isolate W vias, or plugs, within the dielectric matrix. In a Cu BEOL process, Cu with a suitable conductive barrier layer is typically used as the routing and via layer. The Cu routing and via layers are typically formed with a dual damascene process comprised of dielectric deposition, via patterning and etching partially through the dielectric layer, followed by routing patterning that overlaps the via patterning and simultaneous continued etching of the via(s) to the previous routing layer where the routing overlaps the partially etched vias and etching of a trench for routing that connects to the previous routing layer with the via. An alternate dual damascene process is comprised of dielectric deposition, routing patterning and etching partially through the dielectric layer that stops short of the previous routing layer, via patterning and etching to the previous routing layer where the via is within the partially etched routing and the etching completes the via etch to the previous routing layer. Either doubly etched surface is then filled with a conductive barrier layer, for example by physical vapor deposition, followed by Cu filling, for example by electroplating or physical vapor deposition and electroplating, and finally CMP of the Cu and conductive barrier layer to isolate Cu routing within the dielectric matrix.

Use of either the industry standard W and Cu damascene process flows described above can be used to form a surface for hybrid bonding, subject to a suitable surface topography, for example as provided above. However, when these surfaces are used for hybrid bonding, there will typically be a heterogeneous bond component between metal on one surface and dielectric on the other surface, for example due to misalignment of via surfaces. This can result in via fill material from one bond surface in direct contact with dielectric from the other bond surface and without an intervening conductive barrier that is elsewhere between the Cu or W filled via and the surrounding dielectric.

It is preferable to have a wide process window with a low thermal budget for a direct hybrid bond process technology leveraging materials and processes that are currently qualified in a CMOS BEOL foundry to lower the adoption barrier for qualifying a direct hybrid bond process in that foundry. A Cu BEOL process is an example of such a preferable capability due to the Cu damascene process which has been an industry standard for a number of years and the capability of Cu direct hybrid bond technology to leverage this infrastructure. It has been relatively more challenging to leverage an Al BEOL industry standard process because the two primary metals in this process, W and Al, are more challenging materials to develop either a W or Al direct hybrid bond technology due to a combination of factors including high yield strength, coefficient of thermal expansion (CTE), native oxide, and hillock formation.

SUMMARY OF THE INVENTION

An embodiment of the invention is directed to a method of forming a direct hybrid bond surface including forming a first plurality of metallic contact structures in an upper surface of a first substrate, where a top surface of said structures is below said upper surface; forming a first layer of conductive barrier material over said upper surface and said plurality of metallic contact structures; and removing said first layer of conductive barrier material from said upper surface.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
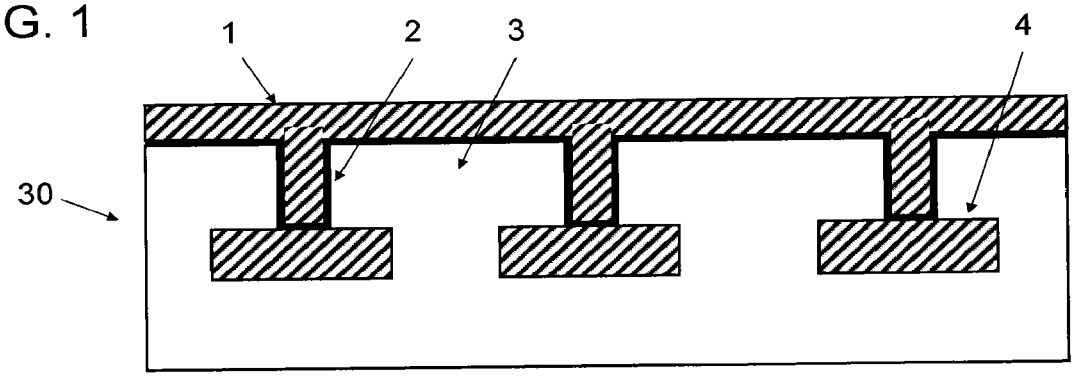
FIG. 1 is a schematic depiction of a cross-section of the near surface region of a single or dual damascene process formed conductive layers, with filled vias and/or routing with a conductive barrier between filled vias and/or routing and surrounding dielectric.

Referring now to the drawings, wherein like reference numerals designate like or corresponding parts throughout the several views, and more particularly to FIG. 1 showing a cross-section of a surface of a substrate 30 in a process for direct hybrid bonding according to the invention comprised of conductor 1, conductive barrier 2, dielectric 3, and metal structure 4. Metal structures 4 are formed in dielectric 3. Metal structures 4 are located within dielectric 3 and can be a contact, pad, line, or other metal interconnect structure. Openings are formed in dielectric 3 over metal structures 4 followed by formation of barrier 2 and conductor 1. The sizes and thicknesses of the conductor 1, conductive barrier 2 and metal structure 4 are not to scale but are drawn to illustrate the invention. While the openings and metal structures are shown to be the same size and shape, they can differ in size and shape depending upon design or need.

A wide variety of metals for conductor 1 are possible including but not limited to Cu, and W which are common in Cu and Al BEOL foundries, respectively. Cu can be deposited by physical vapor deposition (PVD) or electroplating (EP) and W can be deposited by chemical vapor deposition (CVD). A wide variety of conductive barriers for conductive barrier material 2 are also possible which are common in Cu and Al BEOL foundries. Conductive barriers in Cu BEOL processes include tantalum (Ta), titanium nitride (TiN), tantalum nitride (TaN), tungsten nitride (WN), ruthenium oxide ($RuO_2$), tantalum silicon nitride (TaSiN), titanium silicon nitride (TiSiN), tungsten boron nitride (TBN), cobalt tungsten boride (CoWB), cobalt tungsten phosphide or combinations thereof, for example Ti/TiN and Ta/TaN, which can be deposited by a variety of techniques including PVD, CVD, and metal organic CVD (MOCVD). A variety of PVD techniques are available including DC magnetron sputtering, collimated sputtering, and ionized metal plasma (IMP). Conductive barriers in Al BEOL processes include Ti/TiN. Other materials are also possible as barriers, for example nickel (Ni).

A wide variety of dielectrics are also possible including but not limited to silicon oxide, silicon nitride, and silicon carbide nitride which are common in Cu and Al BEOL foundries. A common method to create the surface described by the cross-section in FIG. 1 is with the damascene process described above.

Figure 2:
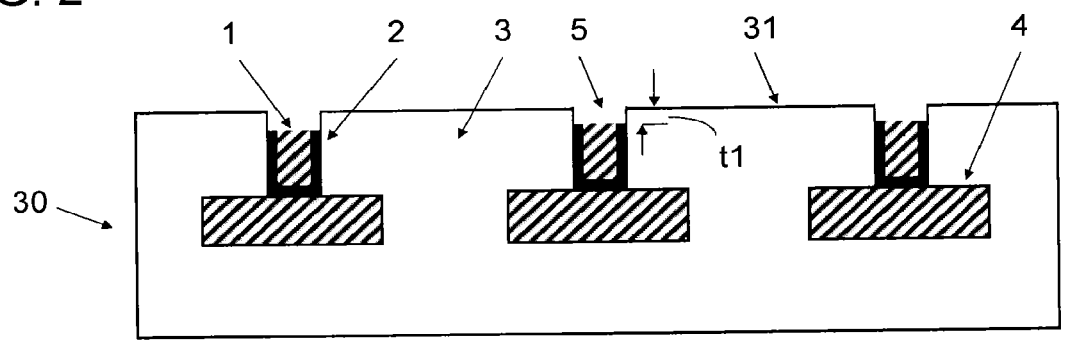
FIG. 2 is a schematic depiction of the cross-section in FIG. 1 after removal of the conductive layers from the surface of a surrounding dielectric.

The upper surface of FIG. 1 is subjected to CMP to remove the portion of conductor 1 and conductive barrier 2 on top of dielectric 3. FIG. 2 illustrates the structure after CMP. The relative heights of conductor 1 and conductive barrier 2 relative to dielectric 3 can be controlled by the CMP portion of the damascene process.

There are a number of configurations of relative height of the conductor 1 and conductive barrier 2 to dielectric 3. The top surfaces of conductor 1 and barrier 2 can be below, even with, nominally even with or above the surface of dielectric 3. In general, direct hybrid bonding is possible with all configurations. However, a preferred configuration is where the relative heights of conductor 1 and conductive barrier 2 are below dielectric 3 by a distance t1. This configuration is conducive to formation of a void-free bond interface and is more manufacturable with regard to variation of the relative height across the bond surface. An example of variation of relative height across the bond surface of the conductive layers below dielectric 3 for a surface most suitable for direct hybrid bonding is one to ten nanometers below the dielectric 3, although smaller and larger variations are also possible. This recess is typically referred to as dishing. The resulting surface is referred to as a hybrid bond surface without a conductive barrier 2.

A typical amount of dishing compatible with hybrid bonding is 0 to 20 nm, referred to as standard dishing. Standard dishing is increased by an amount that is comparable to the thickness of a subsequent conductive barrier 7 shown in FIG. 3 formed on top of this increased dishing forming openings 5 shown in FIG. 2 resulting in a dishing that is comparable to the standard dishing and compatible with that desired for a direct hybrid bond. An example of an increase in standard dishing is 5-20 nm, resulting in a total dishing t1 of about 5-40 nm. This increase in standard dishing can be formed in a variety of ways, for example by increasing the CMP used to create the standard dishing until the desired increased dishing is achieved. This increase in CMP can be accomplished with an increase in CMP time, the amount of which can be determined by routine calibration and can be a function of CMP pad, slurry, downforce, carrier and table rotation, and pattern of conductor and dielectric on the hybrid surface.

Figure 3:
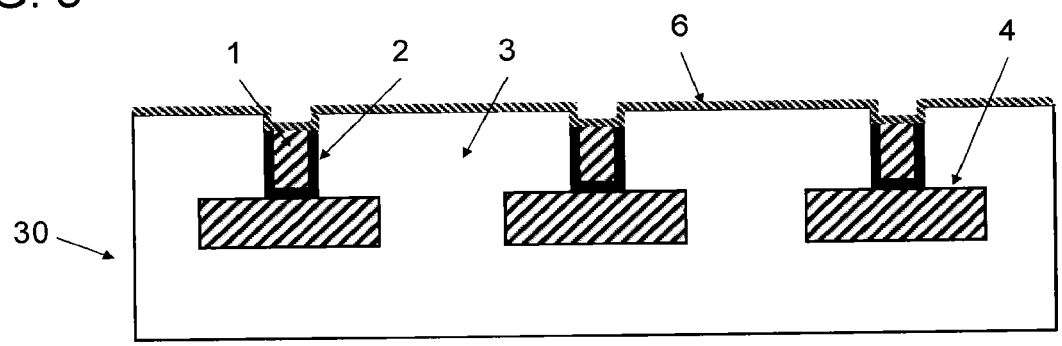
FIG. 3 is a schematic depiction of the cross-section in FIG. 2 after forming a conductive barrier material layer.

As shown in FIG. 3, a layer of conductive barrier metal 6 is formed over the structure on surface 31 shown in FIG. 2. Barrier 6 can be the same or a different material than conductive barrier 2. Formation of barrier 6 on top of the conductor 1 after increased dishing can be formed in a number of ways, for example by a damascene process including deposition of the conductive barrier over the entire surface followed by CMP to remove the conductive barrier from the higher dielectric surface without removing a significant amount or all of the conductive barrier material of layer 6 from within the recess. The barrier formation may also be formed with a selective process, for example electroless nickel electroplating. The resulting structure has conductive barrier 7 in each of the openings 5 on top of conductor 1 and conductive barrier 2. This resulting dishing is preferably compatible with that required for a direct hybrid bond, i,e, the surface of conductive barrier 7 is less than 20 nm, and preferably 1-10 nm, below the surface of dielectric 3. The cross-section of the resulting surface shown schematically in FIG. 4 is referred to as a hybrid bond surface with a conductive barrier 7.

The thickness of the layer 6 can be less than the amount of dishing of conductor 1/barrier 2, as shown in FIG. 3, or can be the same as or thicker than this amount of dishing. In the former case, only a portion or none of the layer 6 is removed from the recess. In the case of the layer 6 being the same or thicker than the amount of recess, layer 6 is removed from within the recess by the CMP. Layer 6 is removed in all cases so that the resulting dishing is less than 20 nm, preferably 1-10 nm, in forming barrier 7.

Each hybrid bond surface of substrate 30 can contain devices and/or integrated circuits (not shown) such that these devices and/or integrated circuits can be connected to each other after completion of the hybrid bond. The devices and circuits can contain metal structures 4 or can be connected to metal structures 4 through further unillustrated interconnect structures.

Figure 4:
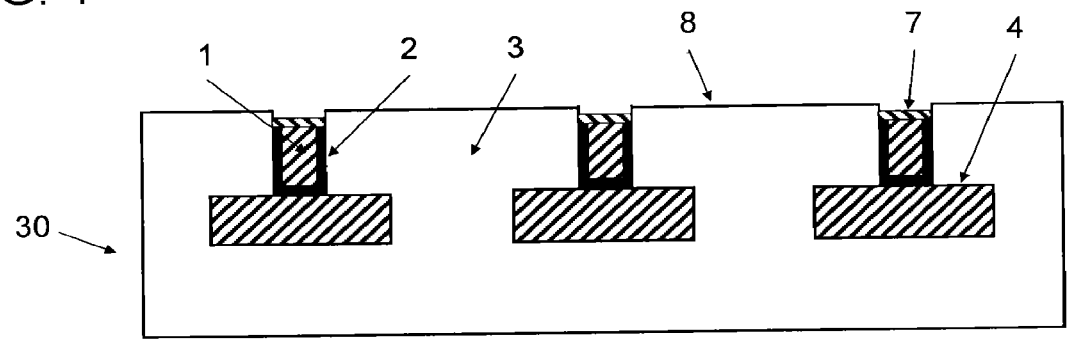
FIG. 4 is a schematic depiction of the cross-section in FIG. 3 after removal of the conductive barrier layer material layer from the surface of the surrounding dielectric.
Figure 5:
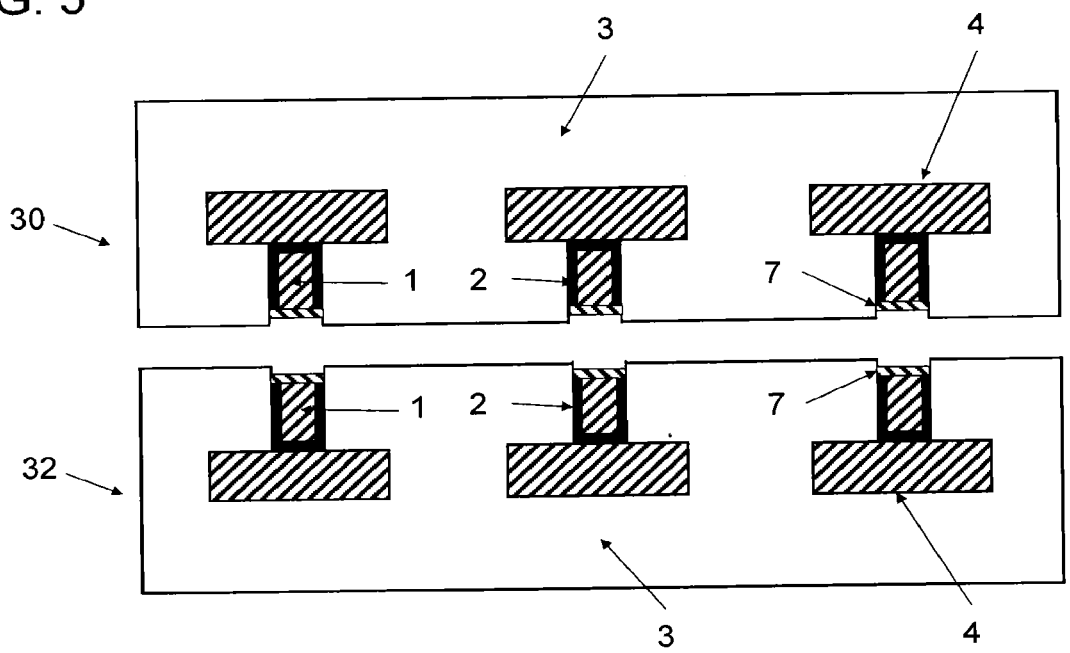
FIG. 5 is a schematic depiction of two hybrid direct bond surfaces being bonded.
Figure 6:
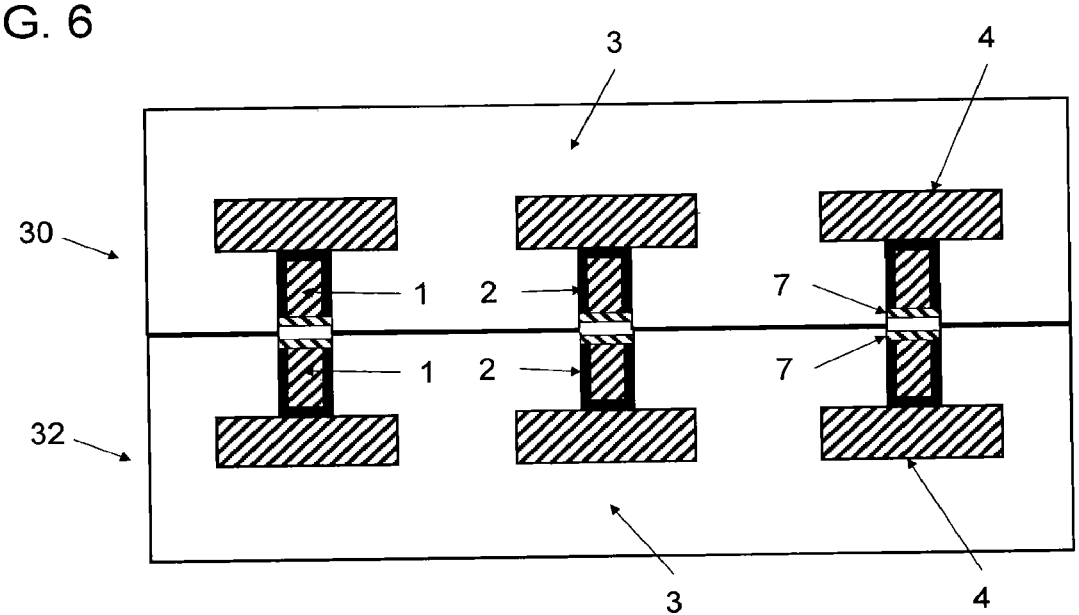
FIG. 6 is a schematic depiction of two hybrid direct bond surfaces after contacting the respective dielectric layers.

Two hybrid bond surfaces of substrates 30 and 32 each having with a conductive barrier 7 with cross-section schematic such as shown in FIG. 4 can now be direct hybrid bonded to each other as shown in the cross-sections of FIGS. 5 and 6 to form direct hybrid bond 12. Substrates 30 and 32 are aligned (FIG. 5) and placed into direct contact such that the dielectric layers 3 in substrates 30 and 32 contact each other (FIG. 6). The alignment and contacting can be performed at room temperature in either room ambient or under vacuum. Although the figures schematically show a gap between the barriers 7 of substrates 30 and 32, there may be partial or significant contact between barriers 7 following the alignment and contacting. While a one-to-one connection arrangement is shown in FIG. 6, other arrangements are possible such as plural metal structures in one substrate are bonded to a single metal structure in another substrate.

The dielectric surfaces of substrates 30 and 32 are preferably prepared as described in application Ser. Nos. 09/505, 283, 10/359,608 and 11/201,321. Briefly, the surfaces may be etched, polished, activated and/or terminated with a desired bonding species to promote and enhance chemical bonding between dielectric 3 on substrates 30 and 32. Smooth surfaces of dielectric 3 with a roughness of 0.1 to 3 nm rms are produced which are activated and/or terminated through wet or dry processes.

As the substrate surfaces contact at room temperature, the dielectric 3 of the substrate surfaces began to form a bond at a contact point or points, and the attractive bonding force between the wafers increases as the chemically bonded area increases. This contact can include barriers 7 or not include barriers 7. If the contact includes barriers 7, the pressure generated by the chemical substrate-to-substrate bonding in dielectric 3 results in a force by which contacting areas of the barriers 7 are strongly joined, and the chemical bonding between the dielectric 3 in substrates 30 and 32 produces electrical connection between metal pads on the two different wafers.

The internal pressure of barriers 7 against each other resulting from the bond between the dielectric 3 of substrates 30 and 32 may not be adequate to achieve an electrical connection with a preferably low resistance due to, for example, a native oxide or other contamination, for example, hydrocarbons. An improved bond or preferably lower resistance electrical connection may be achieved by removing the native oxide on barrier 7. For example, dilute hydrofluoric acid may be used to clean the surface or the surfaces of substrates 30 and 32 may be exposed to an inert ambient, for example nitrogen or argon, after removing the native oxide until bonding is conducted.

The internal pressure also may not be sufficient to contact enough of the surfaces of barriers 7 to each other. Alternatively or in addition, an improved bond or preferably lower resistance electrical connection between barriers 7 can be achieved by heating. Examples of heating include temperatures in the range of 100-400° C. for times between 10 minutes and 2 hours depending upon the materials used for the contact structures 4, barrier 6 and conductor 1. Time and temperature optimization for a given combination of materials is possible. For example, shorter heating times may be possible with higher temperatures and lower temperatures may be possible with longer heating times. The extent to which heating time can be minimized and/or heating temperature can be minimized will depend on the specific structure and materials combination and can be determined with common process optimization practices. For example, if barrier 7 is nickel, a temperature of 300° C. for two hours may be sufficient or a temperature of 350° C. for 15 minutes may be sufficient to improve the bond and improve the electrical connection. Higher and lower temperatures and/or times are also possible depending on barrier 7 material and other materials underneath barrier 7. Temperature increase can result in a preferably low resistance electrical connection by reduction of the native oxide or other contamination or by increasing the internal pressure between barriers 7 due to thermal expansion of conductor 1 and barrier 7. Material 4 and other materials below material 4 (not illustrated) may also increase the thermal expansion of the structure underneath barrier 7 and correspondingly increase pressure between opposed barriers 7. For example, if material 4 is aluminum with associated CTE and Young's modulus, a higher pressure may be generated compared to an alternate material 4 with a lower CTE and/or Young's modulus. Heating may also increase interdiffusion between barriers 7 to produce in a preferable lower-resistance electrical connection.

Figure 7:
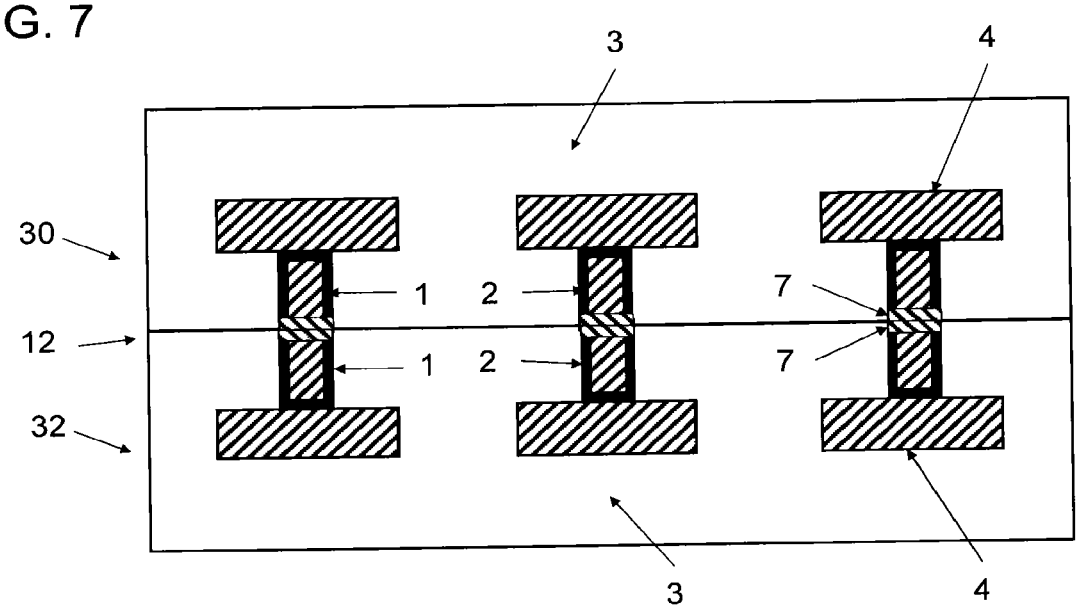
FIG. 7 is a schematic depiction of two hybrid direct bond surfaces directly bonded.

If the initial bond between the dielectric 3 of substrates 30 and 32 does not include barriers 7, heating can be used to result in contact between barriers 7 due to a higher CTE of barrier 7 than dielectric 3. The amount of heating or temperature rise depends on the separation between barriers 7, the thickness, CTE, and Young's modulus of barriers 7 and conductor 1 and metal structure 4 as these parameters affect the pressure between opposed barriers 7 for a given temperature rise. For example, minimizing the separation between barriers 7, for example less than 10 nm, may reduce the heating compared to a separation of 20 nm. As a further example, the height or thickness of barrier 7 and/or conductor 1 will increase pressure as the thermal expansion of barrier 7 and conductor 1 will increase with thickness. For example, the typical increase of expansion of barrier 7 and conductor 1 is proportional to thickness. As a further example, conductor 1 with higher Young's modulus is expected to generate higher pressure than an alternate conductor 1 with lower Young's modulus as the higher Young's modulus material is less likely to yield when generating pressure. A barrier 7 with lower Young's modulus may not require as much heating as it may facilitate forming a connection by yielding at a lower pressure. Following heating, the thermal expansion of conductor 1 and barrier 7 thus result in intimately contacted low-resistance connections, as shown in FIG. 7 if barriers 7 are not in intimate contact when the surfaces of substrates 30 and 32 are initially contacted.

Figure 8:
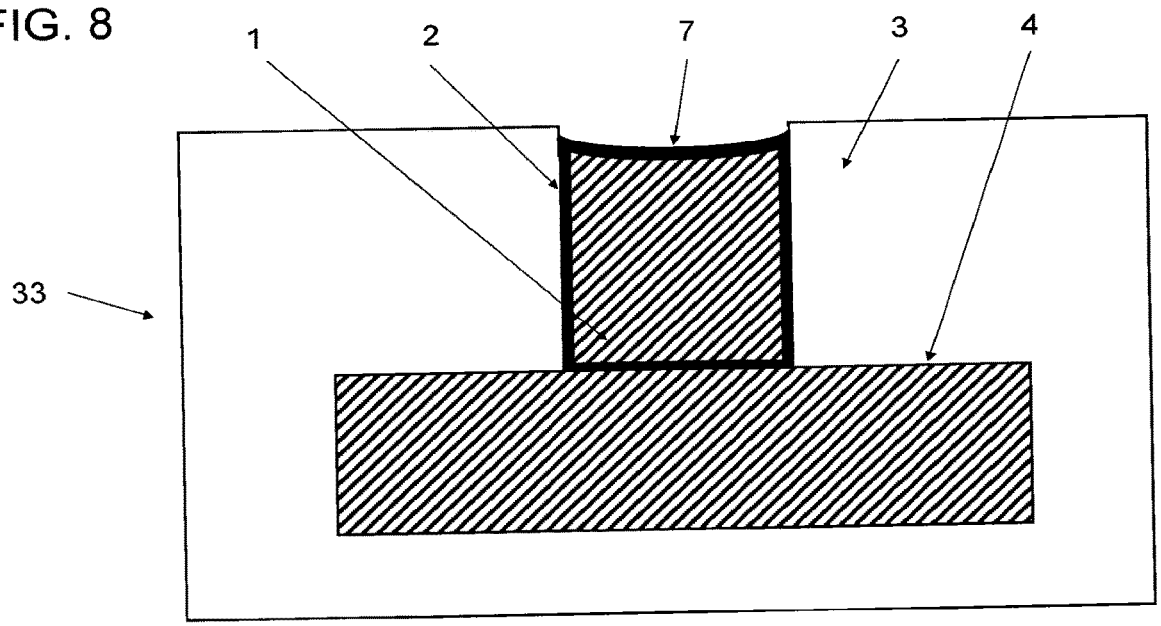
FIG. 8 is a schematic depiction of curvature of the upper surface of the conductive barrier material as a result of dishing.

While the surfaces of conductors 1/barrier 2 and barriers 7 are shown as planar in the above examples, one or both may have some curvature due to the CMP process. A profile is shown in FIG. 8 where both have curvature. In FIG. 8, substrate 33 is shown having barrier 7 and conductor 1/barrier 2 whose surfaces vary. The thickness of barrier 7 is preferably thick enough to accommodate coverage of the roughness of conductor 1 but not too thick to complicate fabrication. Typical thickness ranges can be 5-20 nm. The relative thickness of the barrier at the middle and edge of the curvature can be thicker or thinner depending on the curvature of formation of surface of contact 1 prior to barrier 7 deposition on conductor 1 and curvature of formation of barrier 7, for example due to different characteristics of a CMP process used to form surface of contact 1 and CMP process used to form surface of barrier 7. The center of the barrier 7 is recess less than 20 nm and preferably 1-10 nm below the surface of dielectric 3.

Figure 9:
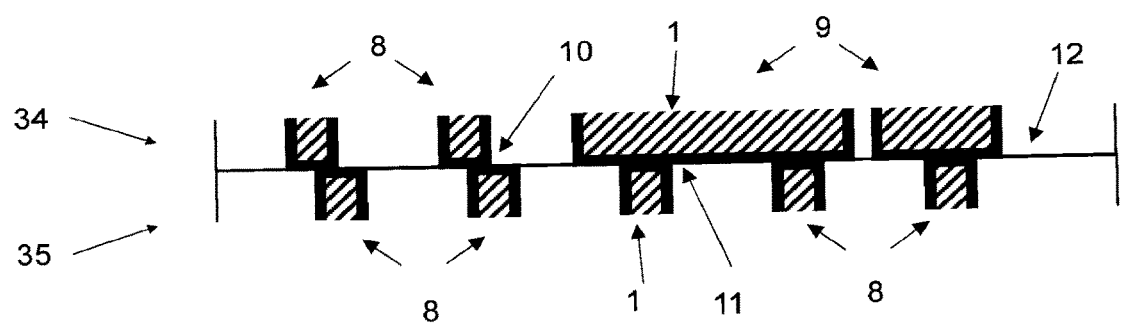
FIG. 9 is a schematic depiction of a pair of substrates, according to the present invention, with misalignment of similar via structures with conductive barriers and alignment of vias with conductive barriers to routing structures with conductive barriers.

FIG. 9 illustrates the upper portion of two substrates 34 and 35 with hybrid bond surfaces. Hybrid bond surfaces with a conductive barrier can comprise via components 8 that are connected to underlying trace components (not shown) or trace components 9 that are connected to underlying via components (not shown). After bonding, there is typically some amount of misalignment between respective hybrid bond surfaces with a conductive barrier. This misalignment can result in contact of conductive barrier 7 on a first hybrid bond surface with a dielectric surface 6 on a second hybrid bond surface and contact of a dielectric surface 6 on a first hybrid bond surface with a conductive barrier 7 on a second hybrid bond surface as shown by 10 in FIG. 9. This misalignment can also result in contact of conductive barrier 7 on one hybrid bond surface with dielectric surface 6 on another surface and the contact of an entire surface of conductive barrier 7 from one surface with a portion of a surface of a conductive barrier 7 on the other hybrid bond surface as shown by 11 in FIG. 9.

Notwithstanding this misalignment, the surface of dielectric 3 on either first or second hybrid bond surface is in contact with either conductive barrier 7 on the other hybrid bond surface and conductive barrier 7 on either first or second hybrid bond surface is in contact with either conductive barrier 7 or the surface of dielectric 3 on the other hybrid bond surface according to the present invention. The conductive barrier 7 on top of conductor 1 thus prevents contact between conductor 2 and dielectric 3 notwithstanding misalignment. This feature of the subject invention can improve reliability of the direct hybrid bond, for example when Cu is used as conductor 1 with Cu single or dual damascene direct hybrid bond surfaces built in a Cu BEOL for applications where there is a concern, for example, of Cu diffusion into dielectric 3 if Cu was in direct contact with dielectric 3. The feature may also facilitate the formation of an electrical connection across the bond interface for some structures, for example where conductor 1 is a W plug single damascene direct hybrid bond surfaces built in an Al BEOL when making electrical connections between conductor 1 on opposing surfaces is more challenging than making electrical connections between conductive barriers 7 on top of conductors 1 on opposing surfaces.

The amount of dishing shown in FIG. 2 can affect the thermal budget of a subsequent direct hybrid bond using these surfaces with recessed conductive portions. For example, after initially placing direct hybrid bond surfaces into direct contact, the dielectric portions may be in direct contact and all or some of the recessed conductive portions may not be in direct contact due to the recess. Heating of these direct hybrid bonded surfaces with recessed conductive portions can result in expansion of the recessed conductive portions so that they are brought into direct contact at a temperature above that at which the direct hybrid bond surfaces were brought into contact and generate significant pressure to facilitate electrical connection between opposed recessed conductive portions and even higher temperatures. These higher temperatures can facilitate the formation of electrical interconnections between opposed recessed conductive portions and completion of the direct hybrid bond. The temperatures required to bring the recessed portions into direct contact and to generate significant pressure to facilitate electrical connection between opposed recessed conductive portions is a combination of the conductive material, residual or native oxide on the conductive material, yield strength of the conductive material and dishing or recess of the conductive material. For example, less dishing can result in a lower thermal budget required to complete the hybrid bond after initially directly bonding opposed dielectric surfaces at low or room temperature due to less conductor 1 and conductive barrier 7 expansion required to form a metallic bond between opposed conductive barrier 7 surfaces.

For example, when using Ni as a conductive barrier, 10 nm of recess may be accommodated by heating to about 350° C. compared to about 200° C. which can be sufficient if using copper without a capping conductive barrier. In order to reduce the thermal budget it is generally useful to use a higher CTE (coefficient of thermal expansion) material with lower yield strength and less dishing. In general, the CTE and yield strength are given by the barrier chosen and the dishing is a variable that can be varied to achieve a suitable thermal budget. The thermal budget can also be influenced by materials that are underneath the conductor. For example, conductors 1 with higher CTE (i.e., above 15 ppm/° C.) underneath conductor 1, for example metal structure 4 as shown in FIG. 4, may have a lower thermal budget to form hybrid bond electrical connections than conductors 1 and/or metal structures 4 with a lower CTE. Examples of metals with high CTE above 15 ppm/° C. include Cu and Al which are conductors common in Al and Cu BEOL processes.

Figure 10:
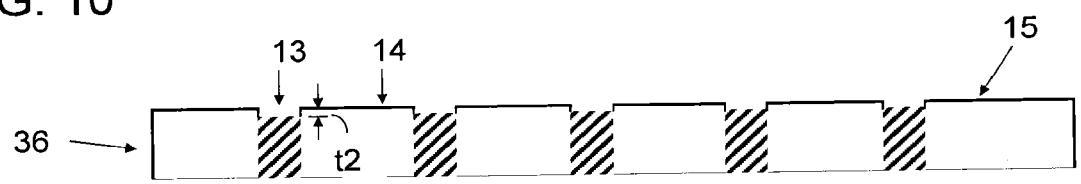
FIG. 10 is a schematic depiction of a cross-section of the near surface region of a surface comprised of a patterned metal layer planarized with surrounding dielectric with planarization exposing patterned metal layer, without a conductive barrier layer laterally between metal layer and surrounding dielectric.

In a second embodiment according to the invention, a conductive portion 13 surrounded by a dielectric portion 14 comprises a direct hybrid bond surface 15 in substrate 36 as shown in FIG. 10. An example of conductive portion 13 is aluminum and an example of dielectric portion 14 is an inter-layer dielectric, examples of which are silicon oxide and other dielectrics used in Al BEOL, which are examples of typical materials used in Al BEOL. The metal portion 13 may include via and/or routing patterns connected to underlying layers of interconnect. The dielectric portion 14 may be contiguous, for example if the conductive portion is comprised only of vias, or may not be contiguous, for example if the conductive portion is separated by routing patterns. In this embodiment direct hybrid bond surface 15 preferably has a dished conductive portion within a direct hybrid bonding specification. This surface can be formed by a combination of an Al metallization, dielectric deposition, and CMP planarization to form the surface with cross-section shown in FIG. 10. The Al metallization may include a conductive barrier on top, for example Ti. If there is a conductive barrier and it is removed by the CMP planarization, the surface will have a cross-section shown in FIG. 10.

Figure 11:
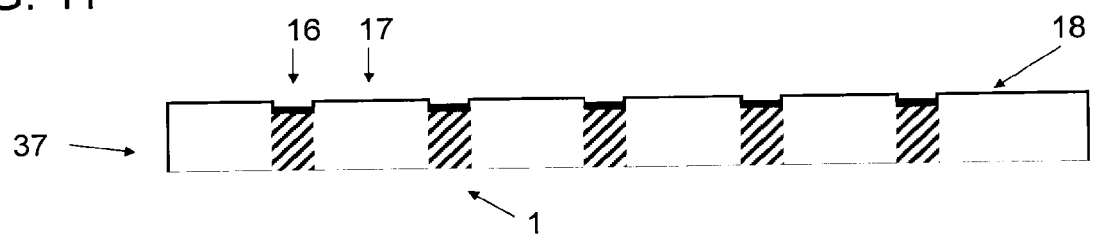
FIG. 11 is a schematic depiction of the cross-section in FIG. 10 with the conductive portion of the exposed surface of the patterned metal layer capped with conductive barrier metal according to the present invention.

If the conductive barrier is sufficiently thick that it is not entirely removed by the CMP planarization, and there is suitable dishing t2, for example 0-20 nm of the conductive barrier portion of the hybrid bond surface for hybrid bonding, then this surface, e.g, as shown in FIG. 11, can be suitable for direct hybrid bonding without additional conductive barrier deposition and CMP.

The dishing t2 described in FIG. 10 is increased by an amount that is comparable to the thickness of a subsequent conductive barrier 16 that is formed on top of this increased dishing resulting in a dishing that is comparable to that in FIG. 10 and compatible with that required for a direct hybrid bond (FIG. 10). This increase in thickness is in the range of about 5-20 nm. This increase in standard dishing can be formed in a variety of ways, for example by increasing the amount of CMP from that used to be compatible with that required for a direct hybrid bond. Formation of the barrier on top of the increased dishing can be formed in a number of ways, for example by a damascene process including deposition of the conductive barrier over the entire surface (similar to FIG. 3) followed by CMP to remove the conductive barrier from the higher dielectric surface 17 without removing a significant amount or all of the conductive barrier from within the recess (FIG. 11). The thickness of the formed barrier can be comparable to, greater than, or less than the increased dishing thickness, for example less than about 40 nm. The final barrier thickness and the dishing can then be controlled by CMP after formation of the barrier.

In this embodiment, this resulting dishing is preferably compatible with that required for a direct hybrid bond. A cross-section of the resulting surface is shown schematically in FIG. 11 illustrating substrate 37 and is referred to as a hybrid bond surface 18 with a conductive barrier 16 not in contact with an underlying conductive barrier. The barrier formation may also be formed with a selective process, for example electro-less nickel electroplating.

Figure 12:
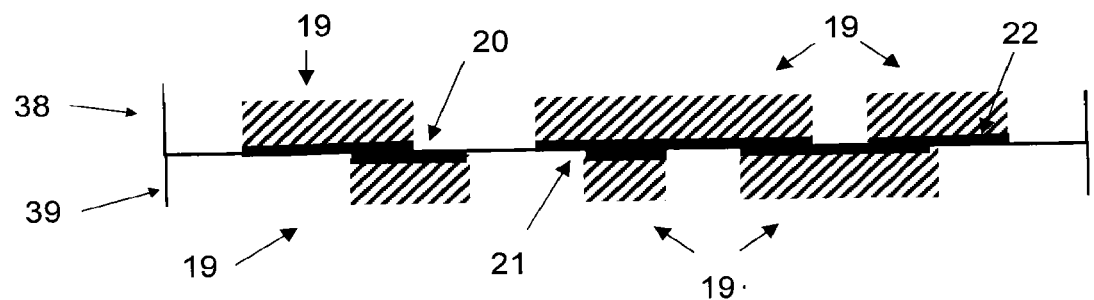
FIG. 12 is a schematic depiction of a pair of contacted substrates, according to the present invention, with an example of alignment of routing structures without conductive barriers to routing structures without conductive barriers laterally between metal layer and surrounding dielectric.

Two hybrid bond surfaces of substrates 38 and 39 with a conductive barrier 16 formed as shown in the cross-section schematic of FIG. 11 can now be direct hybrid bonded to each other as shown in the cross-section of FIG. 12 to form direct hybrid bond with conductive barrier 16 without an underlying conductive barrier. Each hybrid bond surface is a surface of a substrate and each substrate can contain devices and/or integrated circuits such that these devices and/or integrated circuits can be connected to each other after completion of the hybrid bond. Hybrid bond surfaces with a conductive barrier can comprise via components that are connected to underlying trace components (not shown) or trace components 19 that are connected to underlying via components (not shown).

After bonding, there is typically some amount of misalignment between respective hybrid bond surfaces with a conductive barrier. This misalignment can result in contact of conductive barrier 16 on a first hybrid bond surface with a dielectric surface 17 on a second hybrid bond surface in substrate 36 and contact of a dielectric surface 17 on a first hybrid bond surface with a conductive barrier 16 on a second hybrid bond surface as shown by 20 in FIG. 12. This misalignment can also result in contact of conductive barrier 16 on one hybrid bond surface with dielectric surface 17 on another surface and the contact of an surface of conductive barrier 16 from one surface with a portion of a surface of a conductive barrier 16 on the other hybrid bond surface as shown by 21 in FIG. 12.

Notwithstanding this misalignment, dielectric surface 17 on either first or second hybrid bond surface is in contact with either conductive barrier 16 on the other hybrid bond surface and conductive barrier 16 on either first or second hybrid bond surface is in contact with either conductive barrier 16 or dielectric surface 17 on the other hybrid bond surface according to the present invention. This feature can facilitate the formation of an electrical connection across the bond interface for some structures, for example where conductor 13 is an Al routing surface built in an Al BEOL, when making electrical connections between conductor 13 on opposing surfaces is more challenging than making electrical connections between conductive barriers 16 on top of conductors 13 on opposing surfaces.

The amount of dishing shown in FIG. 11 can affect the thermal budget of a subsequent direct hybrid bond using these surfaces. For example, less dishing can result in a lower thermal budget required to complete the hybrid bond after initially directly bonding opposed dielectric surfaces at low or room temperature due to less conductor 13 expansion required to form a metallic bond between opposed conductive barrier 16 surfaces.

Figure 13:
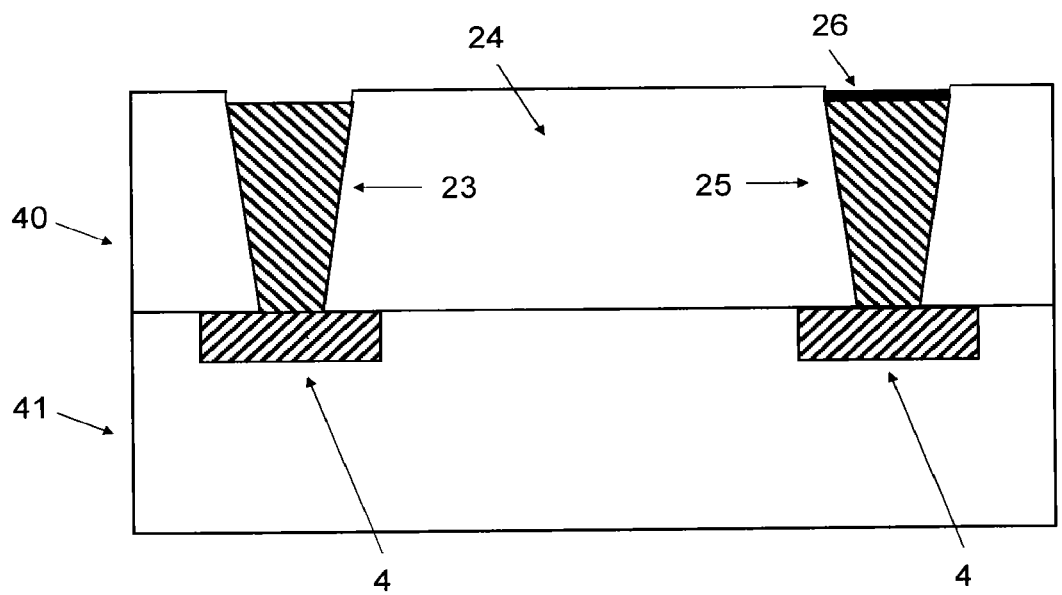
FIG. 13 is a schematic depiction of another embodiment of the invention having a through silicon via structure.
Figure 14:
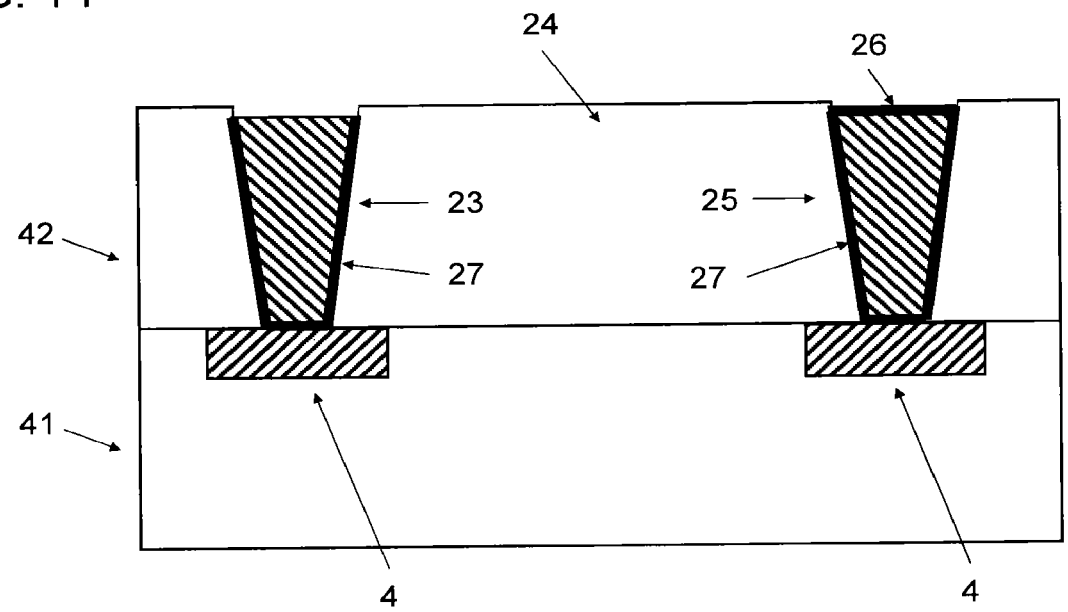
FIG. 14 is a schematic depiction of the structure of FIG. 13 with a second conductive barrier material layer.
Figure 15:
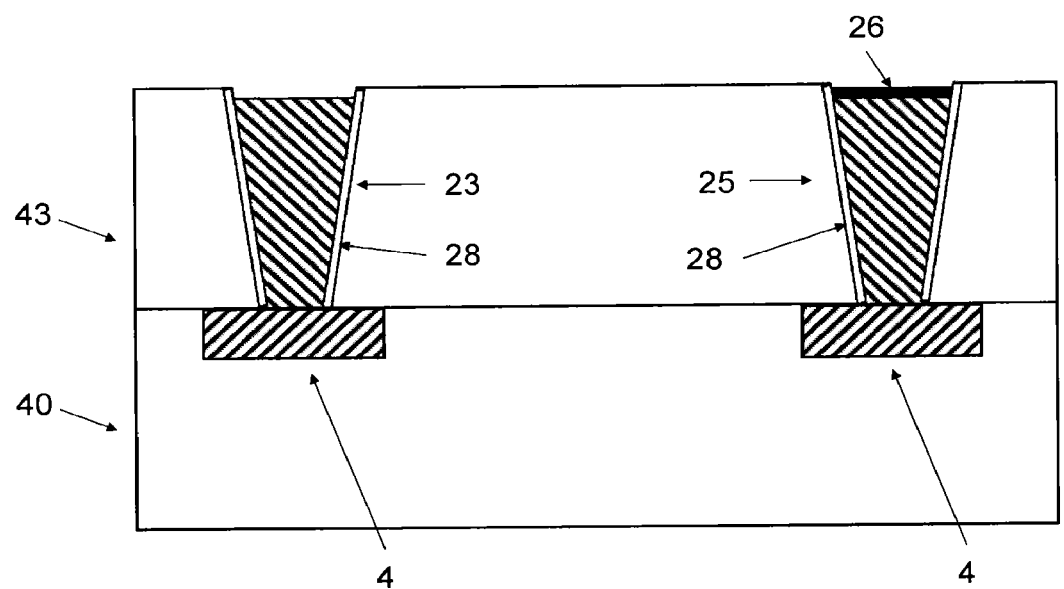
FIG. 15 is a schematic depiction of another embodiment of the invention having a through silicon via structure with a dielectric layer on the sidewall.

In a third embodiment according to the invention, a hybrid surface includes a conductive through silicon via (TSV) structures 23 and 35 as shown in FIGS. 13-15. Each figure shows two different structures, with (23) and without (25) a conductive barrier material layer 26, for convenience of illustration, formed in a manner similar to FIGS. 1-4 above. The TSVs extend through substrate 40 to contact metal conductor 4 in substrate 41. The conductive material of TSV 23 and 25 can be comprised of a metal like Cu or W or a non-metal like polysilicon. The conductive material can be adjacent to an insulating material 24 as shown in FIG. 13 or, as shown in FIG. 14 including substrate 42, may have a barrier layer 27 interposed between the conductive material and insulating material.

In another example, TSV 23 and 25 may have an insulating barrier 28 interposed between the conductive material and a semiconductor substrate 43 as shown in FIG. 15. The TSV may be recessed with increased dishing as described in the first and second embodiments and a conductive barrier 26 formed within this increased dishing as described in the first and second embodiments to form a hybrid bond surface with dishing suitable for direct hybrid bonding. These types of surfaces may be direct hybrid bonded to each other resulting in, for example a so-called back-to-back direct hybrid bond if the TSV surface is exposed through the back of a CMOS structure. It is also possible to use one of these hybrid bond surfaces to form a direct hybrid bond to the hybrid bond surface formed on the front of a CMOS structure, for example on top of a Cu BEOL or Al BEOL, to form a so-called front-to-back direct hybrid bond.

In the present invention BEOL via fill metal can be fully encapsulated with a conductive barrier. Further, the present invention allows hybrid bond fabrication to utilize dielectrics and conductive barrier materials for the direct hybrid bonding. The process window for a direct hybrid bond process leveraging materials and/or processes currently qualified in CMOS BEOL foundries can be improved. The present invention also allows for lowering the adoption barrier for manufacturers to qualify direct hybrid bond technology, produces a direct hybrid bond surface using a combination of insulating dielectric and conductive barrier materials that are used in CMOS BEOLs, can provide a method and structure for a direct hybrid bond surface that suppresses hillock formation, and can reduce thermal budgets in direct hybrid bonding.

Applications of the present invention include but are not limited to vertical integration of processed integrated circuits for 3-D SOC, micro-pad packaging, low-cost and high-performance replacement of flip chip bonding, wafer scale packaging, thermal management and unique device structures such as metal base devices. Applications further include but are not limited to integrated circuits like backside-illuminated image sensors, RF front ends, micro-electrical mechanical structures (MEMS) including but not limited to pico-projectors and gyros, 3D stacked memory including but not limited to hybrid memory cube, high bandwidth memory, and DIRAM, 2.5D including but not limited to FPGA tiling on interposers and the products these circuits are used in including but not limited to cell phones and other mobile devices, laptops, and servers.

Numerous modifications and variations of the present invention are possible in light of the above teachings. It is therefore to be understood that within the scope of the appended claims, the invention may be practiced otherwise than as specifically described herein.

The invention claimed is:

1. An element comprising:
a first dielectric layer having an upper surface configured to directly bond to a second dielectric layer of another element;
a first conductive structure formed in a first portion of the first dielectric layer;
a second conductive structure formed in a second portion of the first dielectric layer laterally spaced from the first portion, the second conductive structure having a different lateral dimension from the first conductive structure; and
a barrier layer, a first portion of the barrier layer formed at least on an upper surface of the first conductive structure, the barrier layer recessed below the upper surface of the first dielectric layer.

2. The element of claim 1, wherein a second portion of the barrier layer is further disposed on the second conductive structure.

3. The element of claim 1, wherein a lateral dimension of the first conductive structure is greater than the lateral dimension of the second conductive structure.

4. The element of claim 3, wherein the first conductive structure is a trace and the second conductive structure is a via.

5. The element of claim 1, wherein the barrier layer has a contact surface configured to contact and directly bond to a conductive material of the other element.

6. The element of claim 1, wherein the upper surface of the first dielectric layer comprises a polished surface.

7. The element of claim 6, wherein the polished surface has a surface roughness of 0.1 nm rms to 3 nm rms.

8. The element of claim 1, wherein the upper surface of the first dielectric layer comprises an activated surface.

9. The element of claim 1, wherein the barrier layer is further disposed along sides of the first conductive structure.

10. The element of claim 9, wherein the barrier layer completely surrounds the first conductive structure.

11. A bonded structure comprising:
a first element including a first dielectric layer having a contact surface, a first conductive structure formed in a first portion of the first dielectric layer, and a second conductive structure formed in a second portion of the first dielectric layer laterally spaced from the first portion;
a second element including a second dielectric layer having a contact surface directly bonded to the contact surface of the first dielectric layer, and a third conductive structure formed in a third portion of the second dielectric layer and electrically coupled with the first and second conductive structure; and a barrier layer disposed at least between the first conductive structure and the third conductive structure.

12. The bonded structure of claim 11, wherein the barrier layer is in direct contact with the first conductive structure.

13. The bonded structure of claim 11, wherein the barrier layer is also disposed between the second conductive structure and the third conductive structure.

14. The bonded structure of claim 11, wherein the third conductive structure comprises a conductive trace.

15. The bonded structure of claim 14, wherein the first and second conductive structures comprise conductive vias.

16. The bonded structure of claim 11, wherein the barrier layer comprises a multi-layer structure in which a first barrier layer directly bonded to a second barrier layer.

17. The bonded structure of claim 11, wherein the first dielectric layer, the second dielectric layer, the first conductive structure, the second conductive structure and the barrier layer form part of a direct hybrid bond.

18. The bonded structure of claim 11, wherein a lateral dimension of the first conductive structure is greater than a lateral dimension of the second conductive structure.

19. The bonded structure of claim 11, wherein at least a portion of the barrier layer contact the first dielectric layer.

20. A bonded structure comprising:
a first element including a first dielectric layer having a contact surface, a first conductive structure formed in a first portion of the first dielectric layer, and a barrier layer at least disposed over the first conductive structure, at least a portion of the barrier layer being in contact with the first dielectric layer; and a second element including a second dielectric layer having a contact surface directly bonded to the contact surface of the first dielectric layer, and a conductive material disposed at least partially in a second portion of the second dielectric layer and directly bonded to the barrier layer.

21. The bonded structure of claim 20, wherein the conductive material comprises a second conductive feature formed in the second portion of the second dielectric layer.

22. The bonded structure of claim 20, wherein the conductive material comprises a second barrier layer formed on a second conductive feature formed in the second portion of the second dielectric layer, the second barrier layer directly bonded to the barrier layer of the first element.

23. The bonded structure of claim 22, wherein the first element further comprising a third conductive structure laterally spaced from the first conductive structure, the third conductive structure electrically connected to the second conductive feature.

* * * * *